United States Patent
Zhang et al.

(10) Patent No.: US 10,985,225 B2
(45) Date of Patent: Apr. 20, 2021

(54) ORGANIC LIGHT-EMITTING DIODE DISPLAY SUBSTRATE AND METHOD FOR MANUFACTURING THE SAME

(71) Applicant: BOE TECHNOLOGY GROUP CO., LTD., Beijing (CN)

(72) Inventors: Feng Zhang, Beijing (CN); Wenqu Liu, Beijing (CN); Zhijun Lv, Beijing (CN); Liwen Dong, Beijing (CN); Shizheng Zhang, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 15/989,014

(22) Filed: May 24, 2018

(65) Prior Publication Data

US 2019/0096969 A1  Mar. 28, 2019

(30) Foreign Application Priority Data

Sep. 26, 2017  (CN) .......................... 201710882740.6

(51) Int. Cl.
*H01L 27/32* (2006.01)
*H01L 51/56* (2006.01)
*H01L 51/52* (2006.01)
*H01L 51/00* (2006.01)
*H01L 51/50* (2006.01)

(52) U.S. Cl.
CPC ...... *H01L 27/3246* (2013.01); *H01L 51/0026* (2013.01); *H01L 51/0096* (2013.01); *H01L 51/5206* (2013.01); *H01L 51/56* (2013.01); *H01L 51/5012* (2013.01)

(58) Field of Classification Search
CPC . H01L 27/3246; H01L 51/56; H01L 51/5206; H01L 51/5012; H01L 51/0026; H01L 51/0096; Y02E 10/549
See application file for complete search history.

(56) References Cited

U.S. PATENT DOCUMENTS

| | | | |
|---|---|---|---|
| 9,373,814 B2 * | 6/2016 | Liu | ........................ H01L 51/56 |
| 9,502,480 B2 * | 11/2016 | Kim | .................... H01L 27/3246 |
| 9,653,526 B2 * | 5/2017 | Li | ...................... H01L 27/3246 |
| 10,304,915 B2 * | 5/2019 | Zhao | .................. H01L 27/3283 |

(Continued)

FOREIGN PATENT DOCUMENTS

| | | |
|---|---|---|
| CN | 103928497 A | 7/2014 |
| CN | 104393192 A | 3/2015 |

(Continued)

OTHER PUBLICATIONS

First Chinese Office Action dated Nov. 22, 2018, received for corresponding Chinese Application No. 20170882740.6.

*Primary Examiner* — Jasmine J Clark
(74) *Attorney, Agent, or Firm* — Kinney & Lange, P.A.

(57) ABSTRACT

The present disclosure provides a method for manufacturing an OLED display substrate, including a step of forming a pattern of a pixel definition layer on a substrate through a patterning process. A bottom wall of the pixel definition layer is formed on the substrate, a top wall of the pixel definition layer is arranged parallel to the bottom wall, and a side wall of the pixel definition layer is angled relative to the top wall at an acute angle.

20 Claims, 2 Drawing Sheets

```
forming a pattern of a gate electrode and a pattern of an    10
OLED anode on a substrate forming a pattern of a pixel definition layer on the          11
substrate through a patterning process forming an organic light-emitting layer at a pixel region     12
between two adjacent pixel definition layers
```

(56) References Cited

U.S. PATENT DOCUMENTS

| | | | |
|---|---|---|---|
| 2005/0112341 A1* | 5/2005 | Ito | H01L 27/3246 428/209 |
| 2008/0218061 A1* | 9/2008 | Chao | H01L 27/3246 313/504 |
| 2009/0302746 A1* | 12/2009 | Lim | H01L 51/5259 313/504 |
| 2010/0193791 A1* | 8/2010 | Chun | H01L 27/3246 257/59 |
| 2016/0254331 A1* | 9/2016 | Wang | H01L 27/3246 257/40 |
| 2016/0351635 A1 | 12/2016 | Li | |
| 2018/0138411 A1 | 5/2018 | Hung et al. | |
| 2018/0204891 A1 | 7/2018 | Zhao | |
| 2018/0286934 A1* | 10/2018 | Zhao | H01L 51/0005 |
| 2018/0301516 A1* | 10/2018 | Huang | G06F 3/0412 |

FOREIGN PATENT DOCUMENTS

| | | |
|---|---|---|
| CN | 104733505 A | 6/2015 |
| CN | 105826355 A | 8/2016 |
| JP | 2007095425 A | 4/2007 |
| JP | 2007227289 A | 9/2007 |

* cited by examiner

ORGANIC LIGHT-EMITTING DIODE DISPLAY SUBSTRATE AND METHOD FOR MANUFACTURING THE SAME

CROSS-REFERENCE TO RELATED APPLICATION

The present application claims a priority of the Chinese patent application No. 201710882740.6 filed on Sep. 26, 2017, which is incorporated herein by reference in its entirety.

BACKGROUND

The present disclosure relates generally to the field of display technology, and more particularly to a method for manufacturing an organic light-emitting diode (OLED) display substrate and an OLED display substrate.

Due to such advantages as self-luminescence, rapid response, wide viewing angle, and the capability of being formed on a flexible substrate, OLEDs have been widely used in high-performance displays.

In the related art, an organic light-emitting layer of an OLED display panel may be formed through an ink-jet printing process. During the formation of the organic light-emitting layer, a light-emitting material climbs upward along a side wall of a pixel definition layer, so the resultant organic light-emitting layer is of a structure thick at a periphery and thin in the middle. Uneven brightness can consequently occur in a pixel region, adversely affecting the performance of the display. Conventional methods for manufacturing OLED display panels tend to be complex, are less effective at suppressing the climbing of the light-emitting material along the side wall of the pixel definition layer.

SUMMARY

In one aspect, the present disclosure provides in some embodiments a method for manufacturing an OLED display substrate, including a step of forming a pattern of a pixel definition layer on a substrate through a patterning process. The pixel definition layer includes a side wall, a top wall and a bottom wall. The bottom wall is formed on the substrate, the top wall is arranged parallel to the bottom wall, and the side wall is angled relative to the top wall at an acute angle.

In a possible embodiment of the present disclosure, the step of forming the pattern of the pixel definition layer on the substrate through the patterning process includes: coating an organic thin film including a photosensitive material onto the substrate; and forming the pattern of the pixel definition layer through a single patterning process.

In a possible embodiment of the present disclosure, the organic thin film has a thickness of 1 to 4 μm.

In a possible embodiment of the present disclosure, the step of forming the pattern of the pixel definition layer through the single patterning process includes: prebaking the substrate coated with the organic thin film; and exposing and developing the prebaked substrate through a mask plate to form the pattern of the pixel definition layer on the substrate.

In a possible embodiment of the present disclosure, the substrate is prebaked at a temperature of 100 to 110° C. for a duration of 130 to 150 seconds. The step of exposing the substrate through the mask plate includes exposing a photoresist of the organic thin film on the substrate using ultraviolet light at exposure energy of 120 to 200 mj, and the photosensitive material is reused as the photoresist.

In a possible embodiment of the present disclosure, the substrate is developed for a duration of 40 to 60 seconds.

In a possible embodiment of the present disclosure, subsequent to the developing the substrate, the method further includes post-baking the substrate at a temperature of 100 to 110° C. for a duration of 80 to 100 seconds.

In a possible embodiment of the present disclosure, subsequent to the step of post-baking substrate, the method further includes curing the substrate.

In a possible embodiment of the present disclosure, the substrate is cured at a temperature of 230° C. for a duration of 60 minutes.

In a possible embodiment of the present disclosure, the pattern of the pixel definition layer includes a plurality of pixel definition layers spaced apart from each other.

In a possible embodiment of the present disclosure, subsequent to the step of forming the pattern of the pixel definition layer on the substrate, the method further includes forming an organic light-emitting layer at a pixel region between two adjacent pixel definition layers.

In another aspect, the present disclosure provides in some embodiments an OLED display substrate including a substrate and a pattern of a pixel definition layer arranged on the substrate. The pixel definition layer includes a side wall, a top wall and a bottom wall, the bottom wall is formed on the substrate, the top wall is arranged parallel to the bottom wall, and the side wall is angled relative to the top wall at an acute angle.

In a possible embodiment of the present disclosure, the pattern of the pixel definition layer includes a plurality of pixel definition layers spaced apart from each other.

In a possible embodiment of the present disclosure, the OLED display substrate further includes an organic light-emitting layer arranged at a pixel region between two adjacent pixel definition layers.

DETAILED DESCRIPTION

In order to make the objects, the technical solutions, and the advantages of the present disclosure more apparent, the present disclosure will be described hereinafter in a clear and complete manner in conjunction with the drawings and embodiments. The following embodiments merely relate to a part of, rather than all of, the embodiments of the present disclosure, and based on these embodiments, a person skilled in the art may, without creative effort, obtain additional embodiments which also fall within the scope of the present disclosure.

Figure 1:
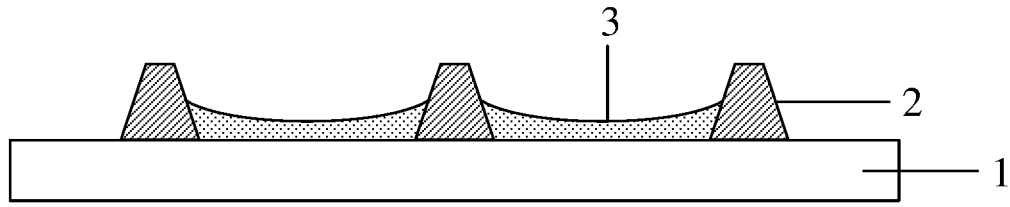
FIG. 1 is a schematic view showing an OLED display substrate in the related art.

In the related art, an organic light-emitting layer of an OLED display panel may be formed through an ink-jet printing process. As shown in FIG. 1, a light-emitting material is accurately sprayed toward a specified pixel region on a substrate 1 including a pixel definition layer 2, so as to form the organic light-emitting layer 3. However, during a curing procedure of the organic light-emitting material, the light-emitting material may climb upward along two side walls of the pixel definition layer 2, so the resultant organic light-emitting layer 3 may be of a structure thick at a periphery and thin in the middle. At this time, uneven brightness may occur to the pixel region, and thus a display effect may be adversely affected.

Figure 2A:
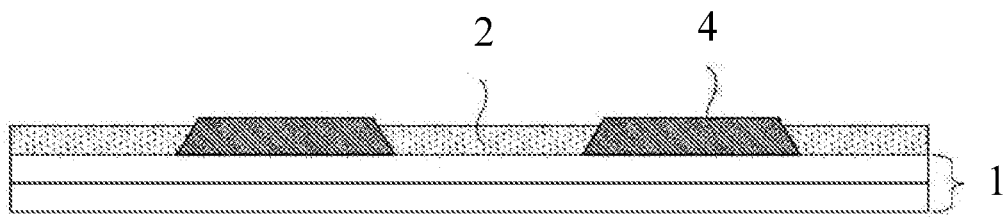
FIGS. 2a and 2b are schematic views showing the manufacture of the OLED display substrate in the related art.
Figure 2B:
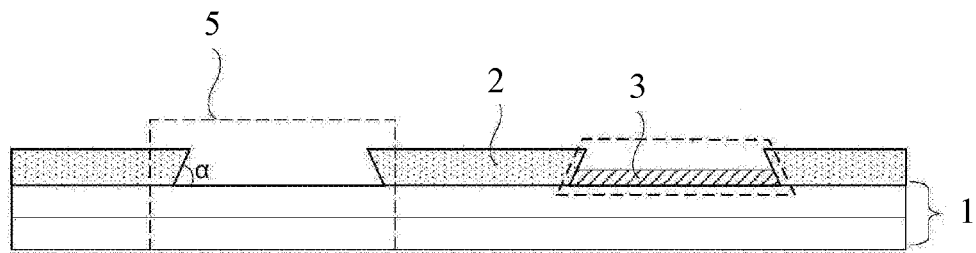
Figure 3:
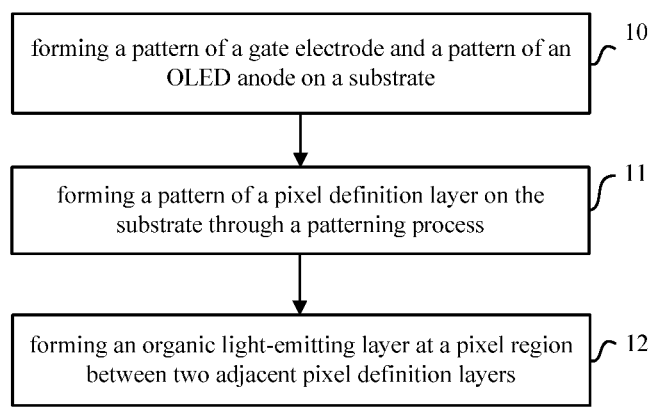
FIG. 3 is a flow chart of a method for manufacturing an OLED display substrate according to some embodiments of the present disclosure.

A method for manufacturing an OLED panel has been proposed so as to solve the above-mentioned problem. As shown in FIGS. 2a and 2b, spacers 4 are formed on the substrate 1 and spaced apart from each other, and a side wall of each spacer 4 is angled relative to a bottom wall of the spacer 4 at an acute angle α. A material for forming the pixel definition layer 2 may be coated onto the substrate 1 with the spacers 4, then the spacers 4 are removed, and then the organic light-emitting layer 3 is formed in a pixel region 5. During the curing procedure of the light-emitting material for forming the organic light-emitting layer 3, it is impossible for the light-emitting material to climb upward along an inclined side wall of the pixel definition layer 2.

However, there exist the following disadvantages for the above-mentioned method. Additional processes for forming and removing the spacers 4 need to be provided, so the manufacture cost may increase. The acute angle α between the side wall of the pixel definition layer 2 and the substrate 1 in the pixel region 5 is smaller than 90°, so it is very difficult to fully remove the spacers 4, i.e., a part of each spacer 4 may remain on the substrate 1, thereby the evenness of the organic light-emitting layer 3 may be adversely affected. An object of the present disclosure is to provide a method for manufacturing an OLED display substrate to simplify the manufacture process, reduce the manufacture cost and improve the evenness of an OLED light-emitting material.

The present disclosure provides in some embodiments a method for manufacturing an OLED display substrate which, as shown in FIGS. 3, 4a-4c and 5, includes step 11 of forming a pattern of a pixel definition layer 2 on a substrate 1 through a patterning process.

Figure 5:
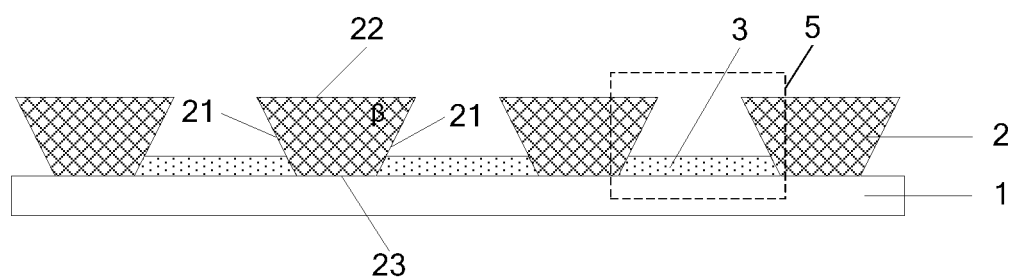
FIG. 5 is a schematic view showing the OLED display substrate according to some embodiments of the present disclosure.

As shown in FIG. 5, the pixel definition layer 2 includes a side wall 21, a top wall 22 and a bottom wall 23. The bottom wall 23 is formed on the substrate 1, the top wall 22 is arranged parallel to the bottom wall 23, and the side wall 21 is angled relative to the top wall 22 at an acute angle β, i.e., the pixel definition layer 2 is of an inverted trapezoidal structure.

In a possible embodiment of the present disclosure, the pattern of the pixel definition layer 2 includes a plurality of pixel definition layers 2 spaced apart from each other. The pixel definition layers 2 may be spaced apart from each other at a same interval or different intervals.

In a possible embodiment of the present disclosure, prior to the step of forming the pattern of the pixel definition layer 2 on the substrate 1, the method further includes step 10 of forming a pattern of a gate electrode and a pattern of an OLED anode on the substrate 1.

According to the method in the embodiments of the present disclosure, the pattern of the pixel definition layer 2 is formed on the substrate 1 through the patterning process in such a manner that the bottom wall 23 of the pixel definition layer 2 is formed on the substrate 1, and the side wall 21 is angled relative to the top wall 22 at the acute angle β. In this way, it is able to directly form the pixel definition layer 2 of an inverted trapezoidal structure on the substrate 1 through the patterning process without any spacers, thereby simplifying the manufacture process of the OLED display substrate and reduce the manufacture cost. In addition, as compared with the related art where a part of each spacer easily remains on the pixel definition layer of a trapezoidal structure, it is able to improve the evenness of an organic light-emitting layer due to the pixel definition layer of the inverted trapezoidal structure, thereby improving the light-emitting property of the OLED display substrate.

In a possible embodiment of the present disclosure, subsequent to step 11, the method further includes step 12 of forming the organic light-emitting layer 3 in a pixel region 5. More specifically, as shown in FIG. 5, the pixel region 5 is arranged between adjacent pixel definition layers 2. A light-emitting material may be accurately sprayed to the pixel region 5 through an ink-jet printing process to form the organic light-emitting layer 3.

Figure 4A:
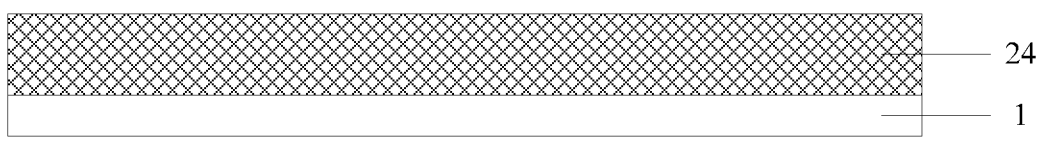
FIGS. 4a to 4c are schematic views showing the formation of the pixel definition layer according to some embodiments of the present disclosure.

The formation of the pixel definition layer 2 will be described hereinafter in more details in conjunction with FIGS. 4a to 4c. To be specific, step 11 includes the following steps 111 and 112.

Step 111: coating an organic thin film 24 onto the substrate 1. To be specific, the organic thin film 24 may be coated through a spinning process. As shown in FIG. 4a, the organic thin film 24 has a thickness of 1 to 4 μm. In a possible embodiment of the present disclosure, the organic thin film 24 has a thickness of 2 μm.

The organic thin film 24 may be made of a resin material, so that two adjacent subpixels on an OLED display panel are spaced apart from each other by the pixel definition layer 2. In a possible embodiment of the present disclosure, the organic thin film 24 may be made of epoxy resin. It should be noted that, the organic thin film 24 includes a photosensitive material, so it is unnecessary to coat a photoresist onto the substrate in a subsequent patterning process, that is, the photosensitive material is reused as the photoresist. In the embodiments of the present disclosure, the description is given in the case that the photosensitive material in the organic thin film 24 is a negative photosensitive material.

Step 112: forming the pattern of the pixel definition layer through a single patterning process.

To be specific, step 112 may include the following steps 1121 to 1123.

Step 1121: prebaking the substrate coated with the organic thin film 24. To be specific, the substrate may be prebaked at a temperature of 100 to 110° C., preferable 100° C., for a duration of 130 to 150 seconds, preferably 150 seconds. Through a prebaking process, it is able to volatilize a solvent in the organic thin film 24, thereby to increase surface viscosity of the organic thin film 24.

Step 1122: exposing and developing the prebaked substrate through a mask plate to form the pattern of the pixel definition layer on the substrate 1.

Figure 4B:
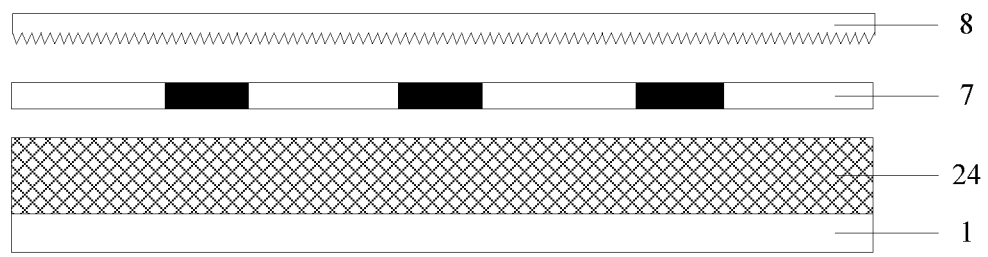

As shown in FIG. 4b, in an exposing step, a surface of the organic thin film 24 is irradiated with ultraviolet light 8 through the mask plate 7, so as to expose a part of the organic thin film 24 at exposure energy of 120 to 200 mj.

Figure 4C:
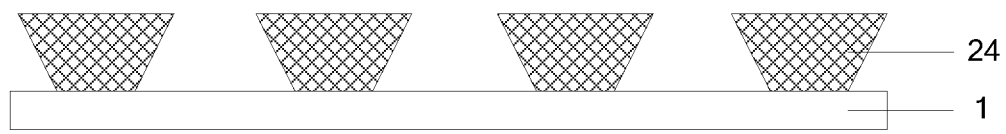

As shown in FIG. 4c, in a developing step, a developing liquid reacts with an unexposed part of the organic thin film 24, so as to remove the unexposed part of the organic thin film 24. In addition, a crosslink reaction occurs to an exposed part of the organic thin film 24, and thus it has been reserved. The organic thin film 24 may be developed for a duration of 40 to 60 seconds, preferably 50 seconds.

In the embodiments of the present disclosure, the description is given in the case that the photosensitive material in the organic thin film 24 is a negative photosensitive material.

It should be appreciated that, in the case that the photosensitive material in the organic thin film 24 is a positive photosensitive material, a mask plate having a pattern different from the mask plate 7 may be adopted. At this time, during the developing procedure, the exposed part of the organic thin film 24 may be removed, and the unexposed part of the organic thin film 24 may be reserved.

Subsequent to the step of developing the organic thin film, the method may further include post-baking the substrate 1 at a temperature of 100 to 110° C., preferably 100° C., for 80 to 100 seconds, preferably 90 seconds. During the developing procedure, the organic thin film 24 may be softened and expanded, so its resistance to corrosion may be adversely affected. Hence, after the developing procedure, it is necessary to remove moisture in the organic thin film 24 through a post-baking process, so as to increase the adhesion between the organic thin film 24 and the substrate 1.

Subsequent to step 1122, i.e., after the post-baking process, the method may further include step 1123 of curing the obtained substrate 1. In this step, the substrate 1 may be baked at a high temperature, e.g., 230° C., for 60 minutes, so as to remove a solvent contained in the organic thin film 24.

As shown in FIG. 5, the present disclosure further provides in some embodiments an OLED display substrate manufactured by using the above-mentioned method. The OLED display substrate includes a substrate, a pattern of a pixel definition layer arranged on the substrate, and an organic light-emitting layer 3 arranged between two adjacent pixel definition layers. Each pixel definition layer 2 includes a side wall 21, a top wall 22 and a bottom wall 23. The bottom wall 23 is formed on the substrate 1, the top wall 22 is arranged parallel to the bottom wall 23, and the side wall 21 is angled relative to the top wall 22 at an acute angle β, i.e., the pixel definition layer 2 is of an inverted trapezoidal structure.

According to the OLED display substrate in the embodiments of the present disclosure, the pixel definition layer 2 of the inverted trapezoidal structure is formed on the substrate 1 through photoetching, so it is able to effectively prevent the light-emitting material from climbing upward along the two side walls 21 of the pixel definition layer 2 during the ink-jet printing process, thereby to improve the thickness evenness of the organic light-emitting layer 3 as well as brightness evenness of an OLED display panel.

The above are merely optional embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A method for manufacturing an organic light-emitting diode (OLED) display substrate, the method comprising a step of forming a pattern of a pixel definition layer on a substrate through a patterning process, wherein the pixel definition layer comprises a side wall, a top wall and a bottom wall, the bottom wall is formed on the substrate, the top wall is arranged parallel to the bottom wall, and the side wall is angled relative to the top wall at an acute angle,
   wherein the step of forming the pattern of the pixel definition layer on the substrate through the patterning process comprises:
      coating an organic thin film comprising a photosensitive material onto the substrate; and
      forming the pattern of the pixel definition layer through one patterning process,
   wherein the step of forming the pattern of the pixel definition layer through the one patterning process comprises:
      prebaking the substrate coated with the organic thin film; and
      exposing and developing the prebaked substrate through a mask plate to form the pattern of the pixel definition layer on the substrate.

2. The method according to claim 1, wherein the organic thin film has a thickness of 1 to 4 μm.

3. The method according to claim 1, wherein the substrate is prebaked at a temperature of 100 to 110° C. for a duration of 130 to 150 seconds, and the step of exposing the substrate through the mask plate comprises exposing a photoresist of the organic thin film on the substrate using ultraviolet light at exposure energy of 120 to 200 mj/cm$^2$, the photosensitive material being reused as the photoresist.

4. The method according to claim 1, wherein the substrate is developed for a duration of 40 to 60 seconds.

5. The method according to claim 1, wherein subsequent to the step of developing the substrate, the method further comprises post-baking the substrate at a temperature of 100 to 110° C. for a duration of 80 to 100 seconds.

6. The method according to claim 5, wherein subsequent to the step of post-baking the substrate, the method further comprises curing the substrate.

7. The method according to claim 6, wherein the substrate is cured at a temperature of 230° C. for a duration of 60 minutes.

8. The method according to claim 1, wherein the pattern of the pixel definition layer comprises a plurality of pixel definition layers spaced apart from each other, and each of the pixel definition layers is of an inverted frustum structure.

9. The method according to claim 8, wherein subsequent to the step of forming the pattern of the pixel definition layer on the substrate, the method further comprises forming an organic light-emitting layer at a pixel region between two adjacent pixel definition layers.

10. The method according to claim 1, wherein prior to the step of forming the pattern of the pixel definition layer on the substrate, the method further comprises forming a pattern of a gate electrode and a pattern of an OLED anode on the substrate.

11. A method for manufacturing an organic light-emitting diode (OLED) display substrate, the method comprising a step of forming a pattern of a pixel definition layer on a substrate through a patterning process, wherein the pixel definition layer comprises a side wall, a top wall and a bottom wall, the bottom wall is formed on the substrate, the top wall is arranged parallel to the bottom wall, and the side wall is angled relative to the top wall at an acute angle,
   wherein prior to the step of forming the pattern of the pixel definition layer on the substrate, the method further comprises forming a pattern of a gate electrode and a pattern of an OLED anode on the substrate.

12. The method according to claim 11, wherein the step of forming the pattern of the pixel definition layer on the substrate through the patterning process comprises:
   coating an organic thin film comprising a photosensitive material onto the substrate; and
   forming the pattern of the pixel definition layer through one patterning process.

13. The method according to claim 12, wherein the organic thin film has a thickness of 1 to 4μm.

14. The method according to claim 12, wherein the step of forming the pattern of the pixel definition layer through the one patterning process comprises:
prebaking the substrate coated with the organic thin film; and
exposing and developing the prebaked substrate through a mask plate to form the pattern of the pixel definition layer on the substrate.

15. The method according to claim 14, wherein the substrate is prebaked at a temperature of 100 to 110° C. for a duration of 130 to 150 seconds, and the step of exposing the substrate through the mask plate comprises exposing a photoresist of the organic thin film on the substrate using ultraviolet light at exposure energy of 120 to 200mj/cm2, the photosensitive material being reused as the photoresist.

16. The method according to claim 14, wherein the substrate is developed for a duration of 40 to 60 seconds.

17. The method according to claim 14, wherein subsequent to the step of developing the substrate, the method further comprises post-baking the substrate at a temperature of 100 to 110° C. for a duration of 80 to 100 seconds.

18. A method for manufacturing an organic light-emitting diode (OLED) display substrate, the method comprising a step of forming a pattern of a pixel definition layer on a substrate through a patterning process, wherein the pixel definition layer comprises a side wall, a top wall and a bottom wall, the bottom wall is formed on the substrate, the top wall is arranged parallel to the bottom wall, and the side wall is angled relative to the top wall at an acute angle, wherein the step of forming the pattern of the pixel definition layer on the substrate through the patterning process comprises:
coating an organic thin film comprising a photosensitive material onto the substrate; and
forming the pattern of the pixel definition layer through one patterning process,
wherein the step of forming the pattern of the pixel definition layer through the one patterning process comprises:
prebaking the substrate coated with the organic thin film; and
exposing and developing the prebaked substrate through a mask plate to form the pattern of the pixel definition layer on the substrate, wherein the substrate is developed for a duration of 40 to 60 seconds.

19. The method according to claim 18, wherein the organic thin film has a thickness of 1 to 4μm.

20. The method according to claim 18, wherein the substrate is prebaked at a temperature of 100 to 110° C. for a duration of 130 to 150 seconds, and the step of exposing the substrate through the mask plate comprises exposing a photoresist of the organic thin film on the substrate using ultraviolet light at exposure energy of 120 to 200mj/cm2, the photosensitive material being reused as the photoresist.

* * * * *